US008064612B2

(12) United States Patent
Sakamoto et al.

(10) Patent No.: US 8,064,612 B2
(45) Date of Patent: Nov. 22, 2011

(54) VEHICULAR ACTIVE VIBRATORY NOISE CONTROL APPARATUS

(75) Inventors: Kosuke Sakamoto, Utsunomiya (JP); Toshio Inoue, Tochigi-ken (JP); Akira Takahashi, Tochigi-ken (JP); Yasunori Kobayashi, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 682 days.

(21) Appl. No.: 12/206,227

(22) Filed: Sep. 8, 2008

(65) Prior Publication Data

US 2009/0067638 A1 Mar. 12, 2009

(30) Foreign Application Priority Data

Sep. 10, 2007 (JP) ................................ 2007-234075

(51) Int. Cl.
*H03B 29/00* (2006.01)
(52) U.S. Cl. ...................... 381/71.4; 381/71.1; 381/71.8
(58) Field of Classification Search ................ 381/71.1, 381/71.11, 71.12, 71.4, 71.8, 86, 94.1
See application file for complete search history.

(56) References Cited

U.S. PATENT DOCUMENTS 5,638,305 A * 6/1997 Kobayashi et al. ........... 700/280
5,692,055 A * 11/1997 Sano et al. ................. 381/71.11
5,809,152 A * 9/1998 Nakamura et al. ........... 381/71.8
7,062,049 B1 * 6/2006 Inoue et al. .................. 381/71.4

FOREIGN PATENT DOCUMENTS

EP 1772852 A1 * 4/2007
JP 2007-025527 A 2/2007

* cited by examiner

*Primary Examiner* — Vivian Chin
*Assistant Examiner* — Friedrich W Fahnert
(74) *Attorney, Agent, or Firm* — Arent Fox LLP

(57) ABSTRACT

A subtractor subtracts a first control signal output from a first bandpass filter from an error signal, and supplies a differential signal to a second bandpass filter. The second bandpass filter, which has a central frequency of 70 Hz, is affected by an operation of the first bandpass filter, i.e., a first control signal, which has a central frequency of 40 Hz. The first bandpass filter is not affected by an operation of the second bandpass filter, i.e., the second control signal.

2 Claims, 11 Drawing Sheets

VEHICULAR ACTIVE VIBRATORY NOISE CONTROL APPARATUS

BACKGROUND OF THE INVENTION

1. Field of the Invention

The present invention relates to a vehicular active vibratory noise control apparatus for canceling road noise generated in the passenger compartment of a vehicle when the vehicle is driven, by causing a canceling sound, which is in opposite phase with and equal in amplitude to the road noise, to interfere with the road noise.

2. Description of the Related Art

Heretofore, there has been proposed in the art a vehicular active vibratory noise control apparatus for canceling road noise (also called "drumming noise") in the passenger compartment of a vehicle, with a canceling sound that is in opposite phase with the road noise at an evaluation point (hearing point) where a microphone is located (see Japanese Laid-Open Patent Publication No. 2007-025527). The road noise is based on vibrations of vehicle wheels, which are caused by the road when the vehicle is running thereon. Such vibrations are transferred through the suspension to the vehicle body, and are excited by the acoustic resonant characteristics of the closed passenger compartment. The road noise has a peak level at a frequency of about 40 [Hz], and has a frequency bandwidth in a range from 20 to 150 [Hz].

In addition to the first peak referred to above at about 40 Hz, the road noise also has a second peak at a frequency of about 70 Hz.

FIG. 10 of the accompanying drawings shows in block form a vehicular active vibratory noise control apparatus 200 for canceling road noise at two frequencies of 40 Hz ($\omega 0=2\pi\times 40$) and 70 Hz ($\omega 1=2\pi\times 70$), based on the technique disclosed in Japanese Laid-Open Patent Publication No. 2007-025527.

The vehicular active vibratory noise control apparatus 200 has two processing circuits 201A, 201B including respective sine-wave generating means 202 for generating sine waves having respective frequencies of 40 Hz and 70 Hz, respective cosine-wave generating means 203 for generating cosine waves having respective frequencies of 40 Hz and 70 Hz, respective pairs of one-tap digital filters 204, 205 for processing the output signals from the sine-wave generating means 202 and the cosine-wave generating means 203, and respective pairs of coefficient updating means 206, 207 for sequentially updating coefficients of the corresponding one-tap digital filters 204, 205. Each of the processing circuits 201A, 201B supplies output signals therefrom to an adder 211, which adds the output signals into a signal whose amplitude and phase are adjusted by an adjusting circuit 208. The adjusted signal is supplied from the adjusting circuit 208 to a speaker 209, which radiates a canceling sound. A microphone 210 detects an interference sound generated by interference between the canceling sound and the road noise, and inputs an output signal, which is representative of the detected interference sound, to the processing circuits 201A, 201B.

FIG. 11A of the accompanying drawings shows a characteristic curve 212 of the road noise input to the processing circuit 201A, together with a characteristic curve 214 of the output signal from the processing circuit 201A. FIG. 11B of the accompanying drawings shows a characteristic curve 212 of the road noise input to the processing circuit 201B, together with a characteristic curve 214 of the output signal from the processing circuit 201B. As shown in FIG. 11A, the characteristic curve 214 is of the same amplitude as the characteristic curve 212 at 40 Hz, but is lower in amplitude than the characteristic curve 212 at 70 Hz. Conversely, as shown in FIG. 11B, the characteristic curve 214 is of the same amplitude as the characteristic curve 212 at 70 Hz, but is lower in amplitude than the characteristic curve 212 at 40 Hz. Therefore, the processing circuits 201A, 201B affect each other in operation at all times, which tends to cause the processing circuits 201A, 201B to become unstable in operation.

In addition, there are certain technical difficulties that occur when a single adjusting circuit 208 is utilized to adjust road noise components of 40 Hz and 70 Hz in amplitude and phase.

SUMMARY OF THE INVENTION

It is an object of the present invention to provide a vehicular active vibratory noise control apparatus, which is capable of stably controlling road noise at two peak frequencies.

In a vehicular active vibratory noise control apparatus according to a first aspect of the present invention, a first bandpass filter extracts a first control signal relative to a first frequency component of a road noise. A first phase adjuster generates a first canceling signal by adjusting the first control signal in phase. A canceling sound output unit outputs a first canceling sound based on the first canceling signal. An error signal detector detects, as an error signal, a residual vibratory noise due to interference between the first canceling sound and the road noise at an evaluation point. The first bandpass filter is supplied only with the error signal, which is input thereto, and extracts the first control signal from the error signal.

A second bandpass filter extracts a second control signal relative to a second frequency component of the road noise. A second phase adjuster generates a second canceling signal by adjusting the second control signal in phase. An adder adds the first canceling signal and the second canceling signal together into a sum signal, and outputs the sum signal to the canceling sound output unit.

The canceling sound output unit outputs a canceling sound based on the sum signal. The error signal detector detects, as the error signal, a residual vibratory noise due to interference between the canceling sound and the road noise. The second bandpass filter is supplied with a signal produced by subtracting the first control signal from the error signal, and extracts the second control signal from the supplied signal.

According to the first aspect of the present invention, the first bandpass filter, whose output is connected to the input of the first phase gain adjuster that outputs the first canceling signal, is supplied only with the error signal detected by the error signal detector, whereas the second bandpass filter, whose output is connected to the input of the second phase gain adjuster that outputs the second canceling signal, is supplied with the signal produced by subtracting the first control signal output from the first bandpass filter from the error signal. Therefore, the first and second bandpass filters do not affect each other in operation, and the vehicular active vibratory noise control apparatus can stably control road noise having two peak frequencies.

In a vehicular active vibratory noise control apparatus according to a second aspect of the present invention, a first phase adjuster generates a first canceling signal by adjusting a first control signal in phase. A canceling sound output unit outputs a first canceling sound based on the first canceling signal. An error signal detector detects, as an error signal, a residual vibratory noise due to interference between the first canceling sound and a road noise at an evaluation point. A first signal processor outputs the first control signal.

The first signal processor comprises a first standard signal generator for generating a first standard signal relative to a first frequency component of the road noise, a first adaptive filter for generating the first control signal based on the first standard signal, and a first filter coefficient updater for sequentially updating a first filter coefficient of the first adaptive filter based on a signal produced by subtracting the first control signal of a preceding sample from the error signal.

A second phase adjuster generates a second canceling signal by adjusting a second control signal in phase. An adder adds the first canceling signal and the second canceling signal together into a sum signal, and outputs the sum signal to the canceling sound output unit. A second signal processor outputs the second control signal.

The canceling sound output unit outputs a canceling sound based on the sum signal. The error signal detector detects, as the error signal, a residual vibratory noise due to interference between the canceling sound and the road noise. The second signal processor comprises a second standard signal generator for generating a second standard signal relative to a second frequency component of the road noise, a second adaptive filter for generating the second control signal based on the second standard signal, and a second filter coefficient updater for sequentially updating a second filter coefficient of the second adaptive filter, based on a signal produced by subtracting the second control signal of a preceding sample and the first control signal of the preceding sample from the error signal.

The first signal processor, whose output is connected to the input of the first phase gain adjuster that outputs the first canceling signal, is supplied only with the error signal detected by the error signal detector, whereas the second signal processor, whose output is connected to the input of the second phase gain adjuster that outputs the second canceling signal, is supplied with both the error signal and the first control signal to be subtracted from the error signal. Therefore, the first and second signal processors do not affect each other in operation, and the vehicular active vibratory noise control apparatus can stably control road noise having two peak frequencies.

Either the first frequency or the second frequency of the road noise may be higher than the other. Specifically, if the first frequency is 40 Hz, for example, then the second frequency is 70 Hz. Conversely, if the first frequency is 70 Hz, then the second frequency is 40 Hz.

The vehicular active vibratory noise control apparatus according to the present invention is thus capable of performing stable control of road noise having two peak frequencies.

The above and other objects, features, and advantages of the present invention will become more apparent from the following description when taken in conjunction with the accompanying drawings in which preferred embodiments of the present invention are shown by way of illustrative example.

DESCRIPTION OF THE PREFERRED EMBODIMENTS

Figure 1:
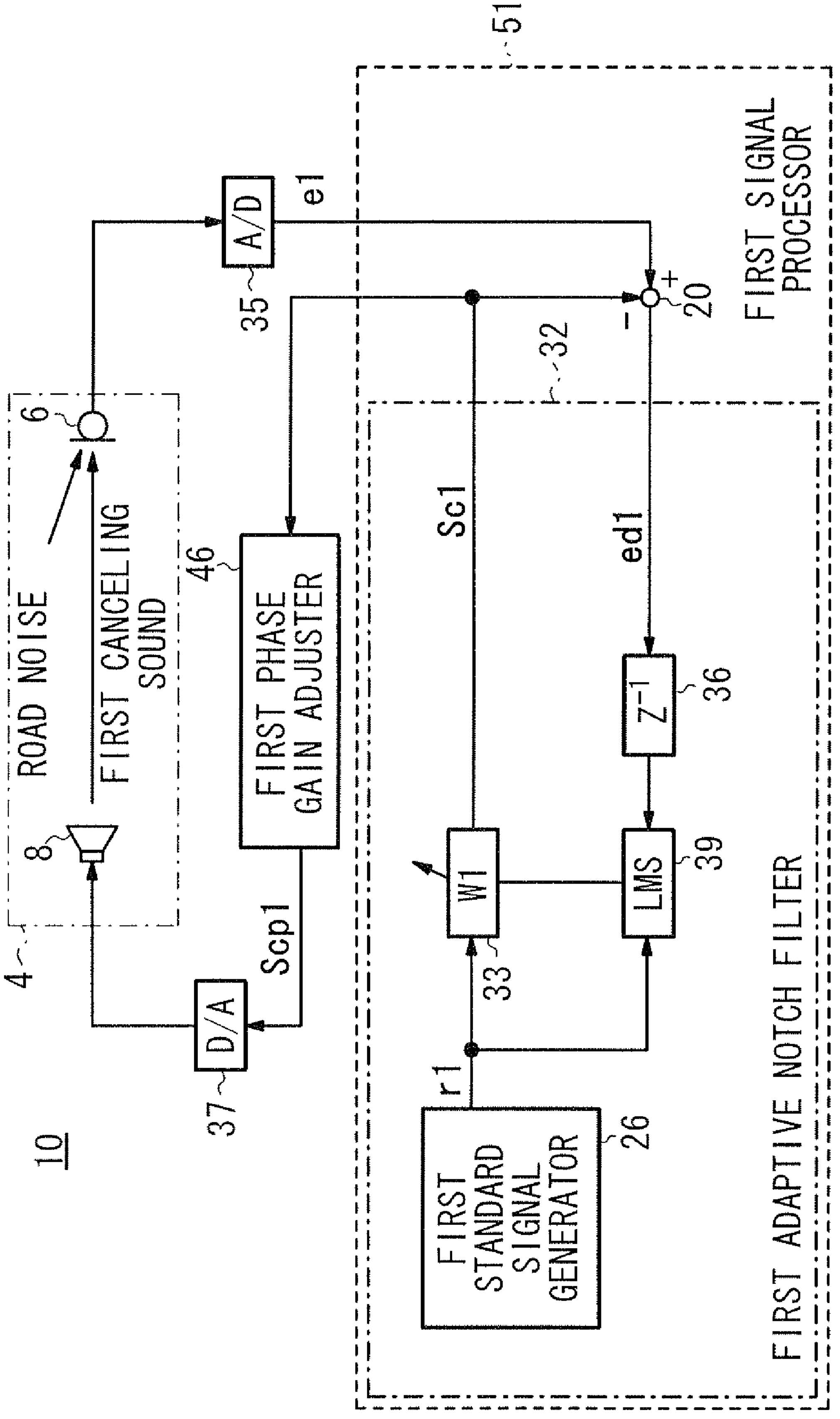
FIG. 1 is a block diagram showing a general configuration of a vehicular active vibratory noise control apparatus for controlling noise having a single peak frequency, which serves as background art for the present invention.

Like or corresponding parts are denoted by like or corresponding reference characters throughout the views.

First, for easier understanding of the present invention, a vehicular active vibratory noise control apparatus for controlling noise having a single peak frequency, which serves as background art for the present invention, will be described below. Thereafter, vehicular active vibratory noise control apparatus according to preferred embodiments of the present invention will be described.

A. Vehicular Active Vibratory Noise Control Apparatus for Controlling Noise Having a Single Peak Frequency, which Serves as Background Art for the Present Invention.

FIG. 1 shows in block form a general configuration for a vehicular active vibratory noise control apparatus 10 for controlling noise having a single peak frequency fd.

Figure 2:
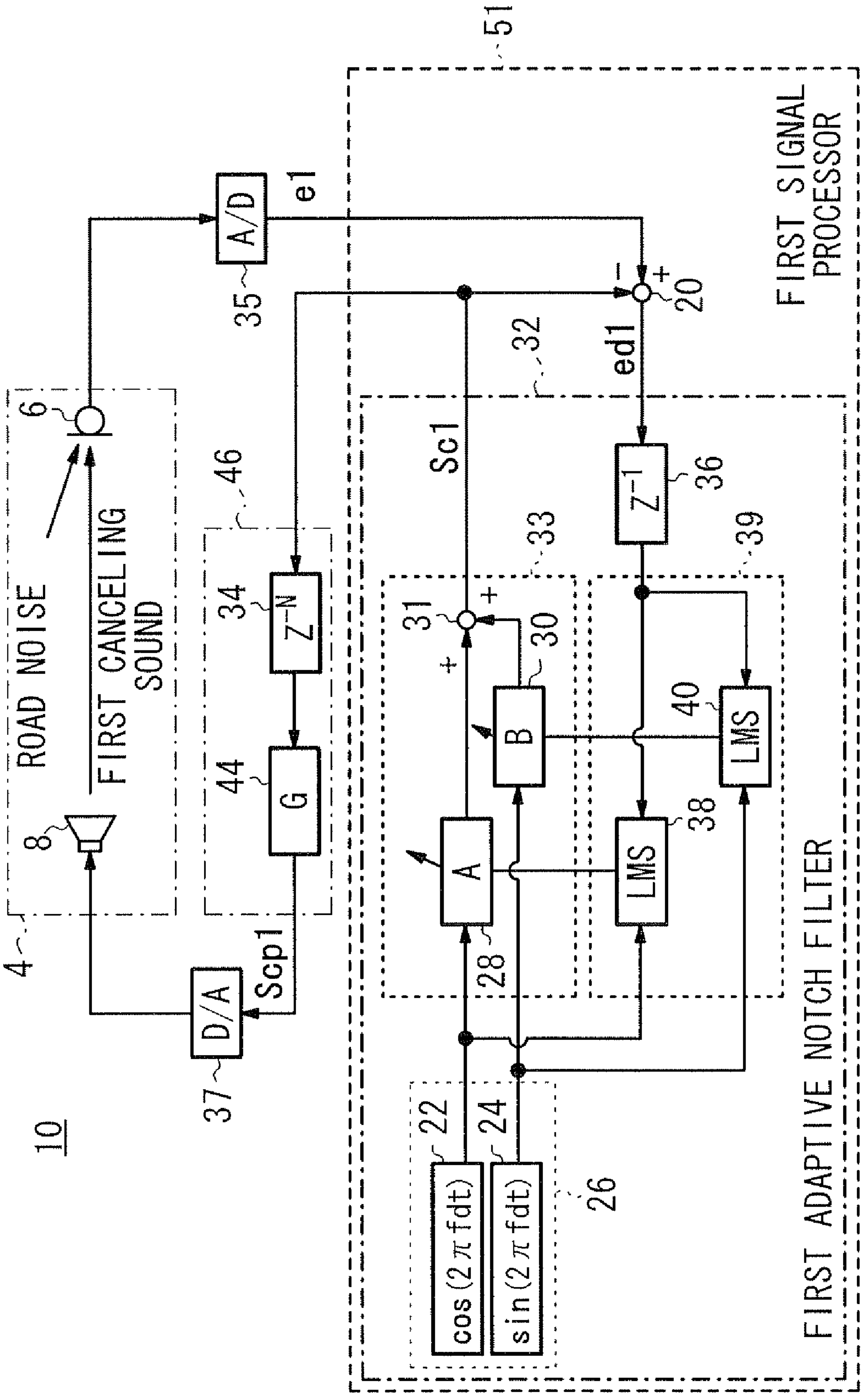
FIG. 2 is a block diagram showing a detailed configuration of the vehicular active vibratory noise control apparatus shown in FIG. 1.

FIG. 2 shows in block form a detailed configuration of the vehicular active vibratory noise control apparatus 10 shown in FIG. 1.

As shown in FIGS. 1 and 2, the vehicular active vibratory noise control apparatus 10 basically comprises a first signal processor 51 for outputting a first control signal Sc1 based on an error signal e1 supplied as a digital signal from an A/D converter 35, a first phase gain adjuster 46 for generating a first canceling signal Scp1 by adjusting the phase and gain of the first control signal Sc1, a speaker 8 acting as a canceling sound output unit for outputting the first canceling signal Scp1, which has been converted into an analog signal by a D/A converter 37, as a first canceling sound into an interior compartment space 4, and a microphone 6 serving as an error signal detector for detecting, as the error signal e1, a residual vibratory noise due to interference between the first canceling sound and the road noise at an evaluation point within the interior compartment space 4.

The first signal processor 51 comprises a subtractor 20 and a first adaptive notch filter 32.

The first adaptive notch filter 32 comprises a first standard signal generator 26 for generating a first standard signal r1 relative to a component of the road noise that has the first frequency fd, a first adaptive filter 33 for generating the first control signal Sc1 based on the first standard signal r1, and a first filter coefficient updater 39 for sequentially updating a first filter coefficient W1 of the first adaptive filter 33, based on a signal ed1 (ed1=e1−Sc1) produced by subtracting the control signal Sc1 of a preceding sample, which is delayed by a one-sample time delay device 36, from the error signal e1.

As shown in FIG. 2, the first standard signal generator 26 comprises a cosine signal generator 22 for generating a cosine signal cos(2πfdt) as a standard signal, and a sine signal generator 24 for generating a sine signal sin(2πfdt) as a standard signal. The cosine signal cos(2πfdt) and the sine signal sin(2πfdt) are defined as having a first frequency fd (in the present embodiment, fd=42 Hz≈40 Hz) of the road noise.

The first adaptive filter 33 comprises a one-tap adaptive filter 28 for multiplying the cosine signal cos(2πfdt) by a filter coefficient A and outputting the product signal A×cos(2πfdt), a one-tap adaptive filter 30 for multiplying the sine signal sin(2πfdt) by a filter coefficient B and outputting the product signal B×sin(2πfdt), and an adder 31 for outputting the sum of the signals A×cos(2πfdt) and B×sin(2πfdt) as the control signal Sc1.

The first filter coefficient updater 39 comprises two filter coefficient updaters 38, 40 that are supplied with the cosine signal cos(2πfdt) and the sine signal sin(2πfdt), respectively, and also with the signal ed1 delayed by a one-sample time. The first filter coefficient updater 39 sequentially updates the filter coefficients A, B of the one-tap adaptive filters 28, 30 based on an adaptive control algorithm, for minimizing the signal ed1 utilizing, e.g., an LMS (Least Mean Square) algorithm, which carries out a type of steepest descent method.

The first phase gain adjuster 46 includes a delay ($Z^{-N}$) unit 34, which operates as a phase shifter having an N-sample time, and a gain adjuster (amplitude adjuster) 44 connected in series to the delay unit 34. The delay unit 34 and the gain adjuster 44 may be switched in position. The delay unit 34 provides a certain phase delay to the control signal Sc1 supplied from the first signal processor 51 (the first adaptive notch filter 32). The gain adjuster 44 adjusts the amplitude of the delayed control signal Sc1, and outputs the adjusted control signal Sc1 as the first canceling signal Scp1.

A phase delay θd that needs to be set in the delay unit 34 of the first phase gain adjuster 46 shall be described below. For eliminating road noise at the evaluation point where the microphone 6 is positioned, it is required that the first canceling sound and the road noise have a phase difference of 180° therebetween (in opposite phase with each other) and have the same amplitude as each other at the evaluation point. Specifically, the phase delay of the sine signal corresponding to a frequency of 42 Hz of the road noise signal, in a loop that extends from the input point (position) of the microphone 6 through the A/D converter 35, the first signal processor 51 (the subtractor 20 and the first adaptive notch filter 32), the first phase gain adjuster 46, the D/A converter 37, the speaker 8, and the interior compartment space 4 back to the microphone 6, must be 180°. The delay unit 34 may be set to a fixed value for equalizing the phase delay to 180°.

A gain that is set in the gain adjuster 44 of the first phase gain adjuster 46 shall be described below. The gain may be considered in the same manner as the phase delay. The gain adjuster 44 may generally be set to a value (fixed value) for compensating for an attenuated quantity of the canceling sound, in a path leading from the speaker 8, through the interior compartment space 4, and to the microphone 6.

Operation of the vehicular active vibratory noise control apparatus 10, which includes the first phase gain adjuster 46, will be described below with reference to FIG. 1.

The microphone 6 detects a residual noise produced by interference between the road noise and the first canceling sound, and outputs an error signal representing the detected residual noise. The error signal is converted by the A/D converter 35 into a digital error signal e1, which is supplied to the minuend input port of the subtractor 20.

The first adaptive notch filter 32 operates to determine the filter coefficient W1 of the first adaptive filter 33, in order to minimize the signal ed1, which is output from the subtractor 20 to the one-sample time delay device 36. The first adaptive notch filter 32 generates the control signal Sc1, which is supplied to the subtrahend input port of the subtractor 20. The control signal Sc1 has the same amplitude as the error signal e1 and is in phase with the error signal e1, which has the frequency fd of the road noise.

Specifically, the first signal processor 51 is supplied with the error signal e1. The first signal processor 51 includes the first adaptive notch filter 32, which functions as a notch filter having a central frequency fd on the output side of the subtractor 20 where the signal ed1 is generated, and also functions as a bandpass filter (BPF) having a central frequency fd on the subtrahend input side of the subtractor 20 where the control signal Sc1 is generated.

Figure 3:
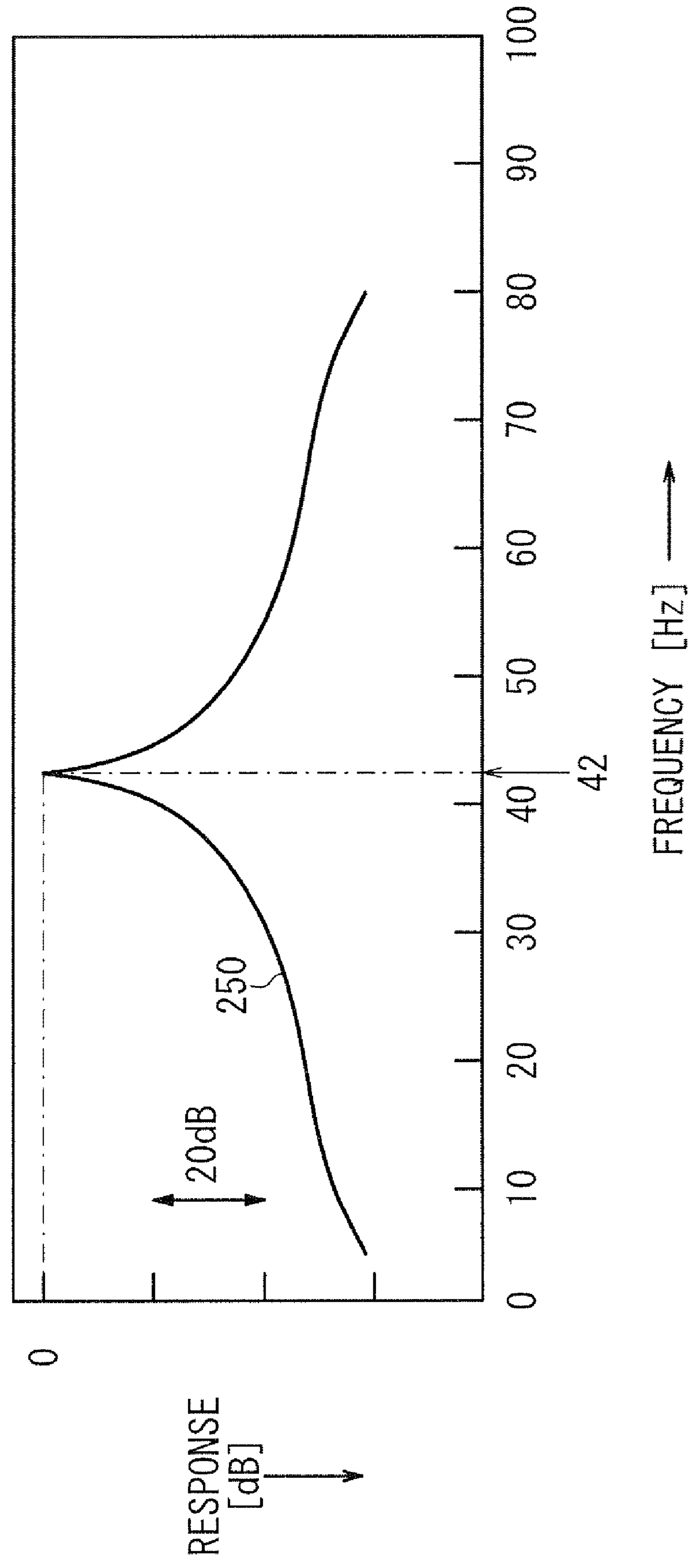
FIG. 3 is a diagram showing a passband frequency characteristic curve at the time a first adaptive filter generates a control signal.

FIG. 3 shows a passband frequency characteristic curve 250 at a point where the first adaptive notch filter 32 generates the control signal Sc1. As can be understood from the passband frequency characteristic curve 250, the first signal processor 51 operates as a bandpass filter exhibiting sharp selectivity at the central frequency fd (fd=42 Hz). Such sharp selectivity can be varied by adjusting a step size parameter as a control parameter.

The formula for updating the filter coefficient W1 is expressed by the following equation (1):

$$W1(n+1)=W1(n)-\mu\cdot ed1(n)\cdot\cos(2\pi fdt\times n\times t) \quad (1)$$

where μ represents the step size parameter.

The control signal Sc1 generated by the first adaptive notch filter 32 is adjusted in phase and amplitude into the canceling signal Scp1 by the first phase gain adjuster 46. The canceling signal Scp1 is supplied to the speaker 8, which outputs a first canceling sound that is in opposite phase with and has the same amplitude as the road noise. The first canceling sound interferes with the road noise at the microphone 6, thereby canceling the road noise.

Since the first signal processor 51 operates as a bandpass filter exhibiting the passband frequency characteristic curve 250 shown in FIG. 3, the first signal processor 51 may be replaced with a bandpass filter (BPF).

Figure 4:
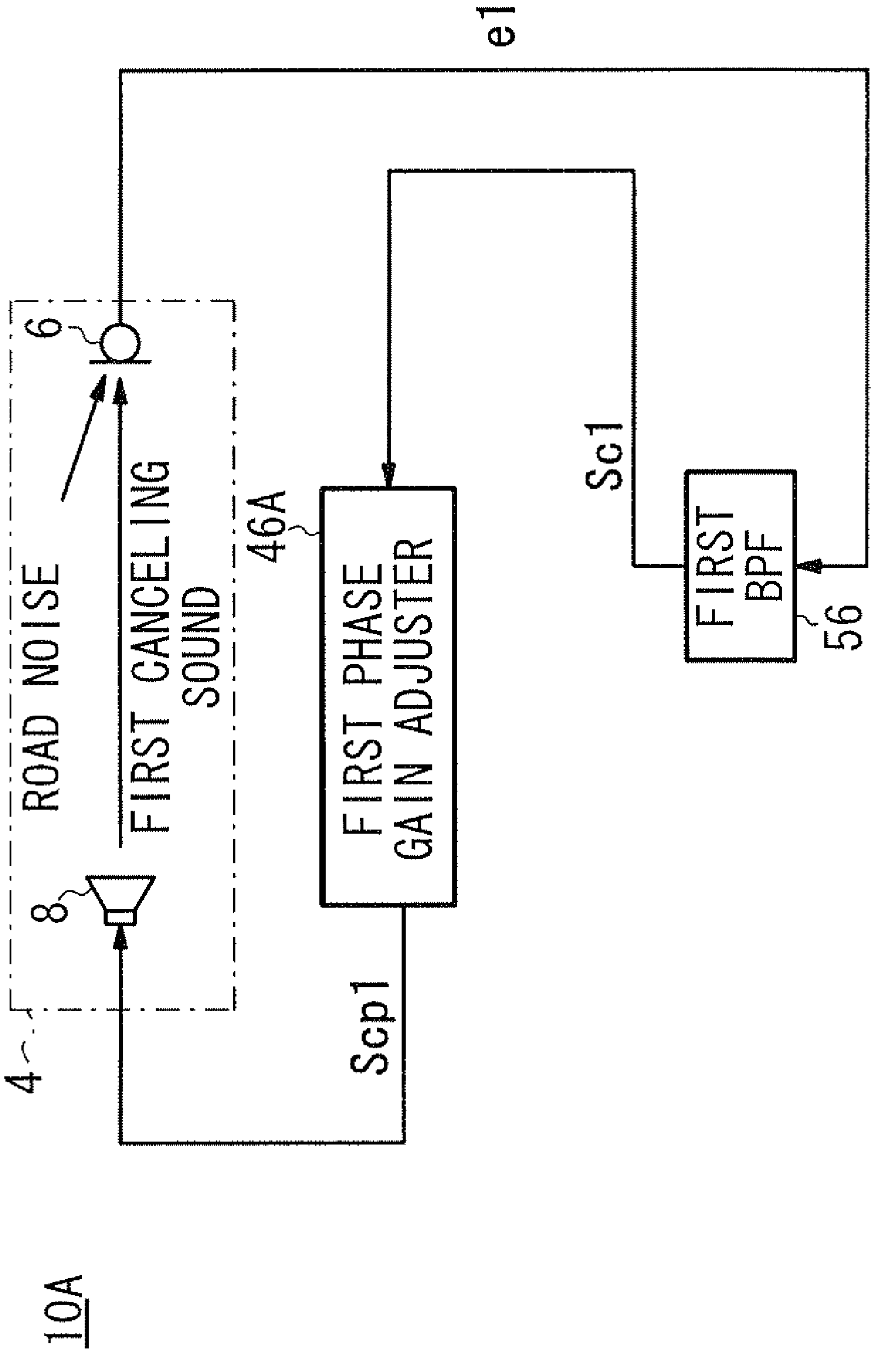
FIG. 4 is a block diagram showing a configuration of an analog vehicular active vibratory noise control apparatus, which employs a bandpass filter in place of a first signal processor.

FIG. 4 shows in block form a configuration of an analog vehicular active vibratory noise control apparatus 10A, which employs a first bandpass filter 56 in place of the first signal processor 51.

Specifically, the vehicular active vibratory noise control apparatus 10A comprises a first bandpass filter 56 for extracting a first control signal Sc1 relative to a component of the road noise that has the first frequency fd, wherein the first bandpass filter 56 has a central frequency set to the first frequency fd. The vehicular active vibratory noise control apparatus 10A further comprises a first phase gain adjuster 46A for generating a first canceling signal Scp1 by adjusting the phase and gain of the first control signal Sc1, a speaker 8 acting as a canceling sound output unit for outputting the first canceling signal Scp1 as a first canceling sound into an interior compartment space 4, and a microphone 6 serving as an error signal detector for detecting, as the error signal e1, a residual vibratory noise due to interference between the first canceling sound and the road noise, at an evaluation point within the interior compartment space 4. The first bandpass filter 56 is supplied only with the error signal e1 as an input signal, and extracts the first control signal Sc1.

Figure 5B:
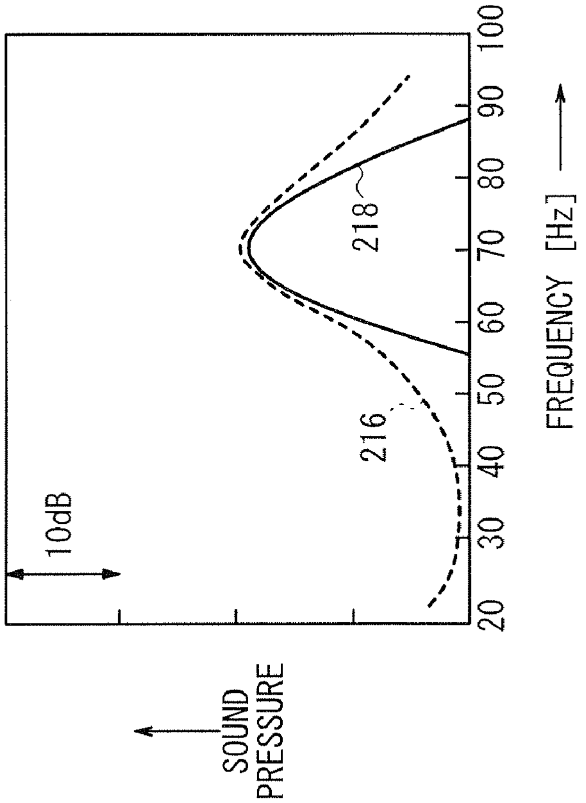
FIG. 5B is a diagram showing a characteristic curve of road noise input to a second signal processor or to a second bandpass filter.
Figure 5A:
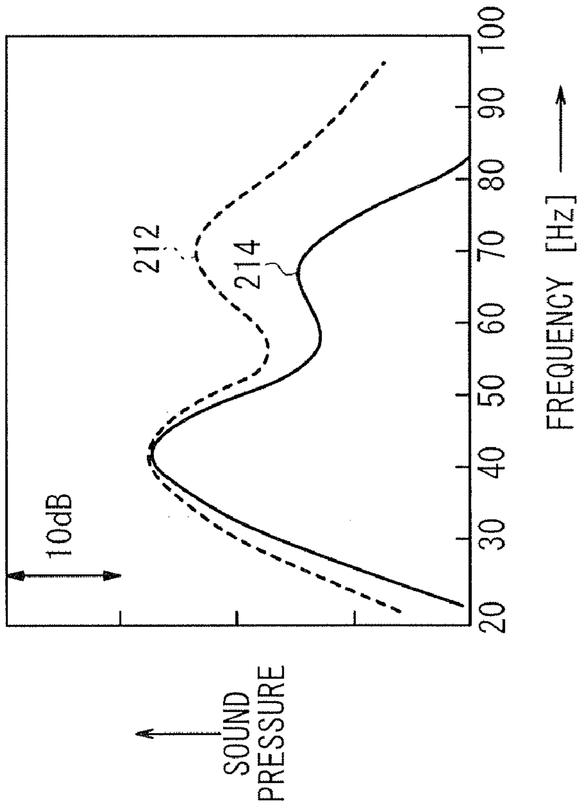
FIG. 5A is a diagram showing a characteristic curve of road noise input to the first signal processor or to a first bandpass filter.
Figure 11A:
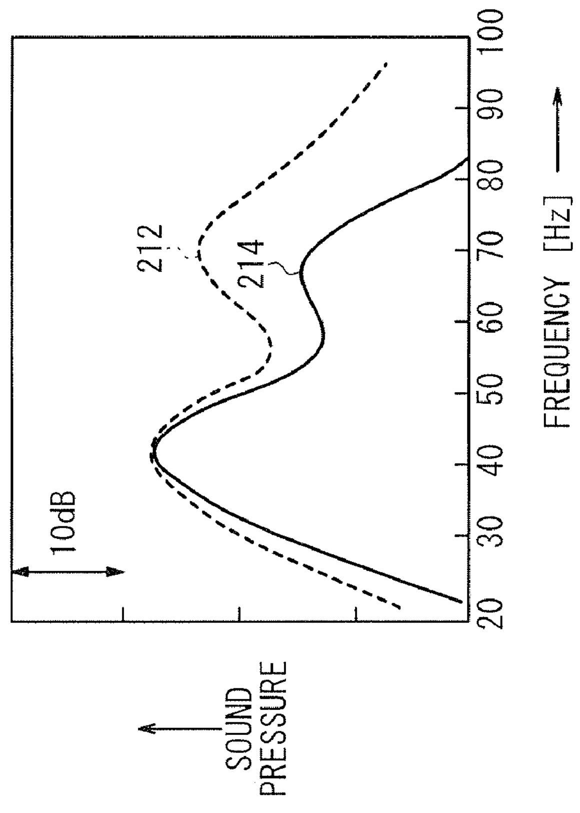
FIG. 11A is a diagram showing input and output characteristic curves of a processing circuit, which processes road noise having a peak frequency of 40 Hz.
Figure 11B:
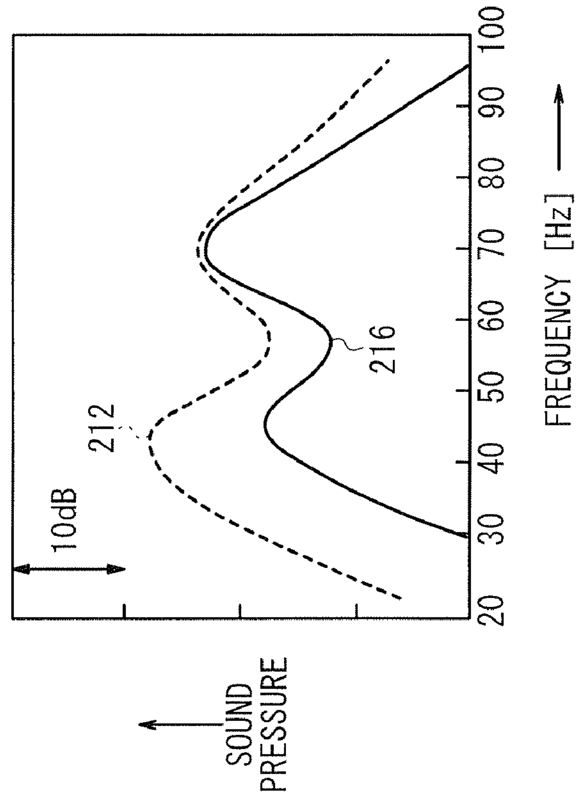
FIG. 11B is a diagram showing input and output characteristic curves of a processing circuit, which processes road noise having a peak frequency of 70 Hz.

FIG. 5A shows a characteristic curve 212 of the road noise input to the first signal processor 51 of the vehicular active vibratory noise control apparatus 10 shown in FIG. 1, or to the first bandpass filter 56 of the vehicular active vibratory noise control apparatus 10A shown in FIG. 4. FIG. 5A also shows a characteristic curve 214 of the control signal Sc1 output from the first signal processor 51 or from the first bandpass filter 56. These characteristic curves 212, 214 are the same as those shown in FIG. 11A.

The first signal processor 51 or the first bandpass filter 56 extracts a component having a central frequency of 42 Hz, i.e., passes the component within the frequency band, for thereby reducing noise at 70 Hz.

The vehicular active vibratory noise control apparatuses 10 and 10A, which serve as background art of the present invention, have been described above. Vehicular active vibratory noise control apparatus according to preferred embodiments of the present invention will now be described below.

B. Vehicular Active Vibratory Noise Control Apparatus 100 According to Embodiments of the Present Invention.

The vehicular active vibratory noise control apparatus 100 differs from the vehicular active vibratory noise control apparatus 10 shown in FIG. 1, in that the vehicular active vibratory noise control apparatus 100 additionally includes a second signal processor 151 connected to a second phase gain adjuster 146 relative to a second frequency fd=70 Hz (=fd2). The second signal processor 151 is connected in parallel with the first signal processor 51, which is connected to the first phase gain adjuster 46 relative to the first frequency fd=42 Hz (=fd1) in the vehicular active vibratory noise control apparatus 10, as shown in FIG. 1. Other details of the vehicular active vibratory noise control apparatus 100 are essentially the same as those of the vehicular active vibratory noise control apparatus 10 shown in FIG. 1.

An error signal e1 output from the A/D converter 35 is supplied to the minuend input ports of respective subtractors 20, 120 of the first and second signal processors 51, 151.

The subtractor 20 supplies a signal ed1, produced by subtracting the first control signal Sc1 from the error signal e1, to the one-sample time delay device 36 of the first adaptive notch filter 32. The subtractor 120 supplies a signal ed2, produced by subtracting first and second control signals Sc1 and Sc2 from the error signal e1, to a one-sample time delay device 136 of a second adaptive notch filter 132.

The second signal processor 151 comprises a second standard signal generator 126 for generating a second standard signal r2 relative to a component of the road noise that has the second frequency fd2, a second adaptive filter 133 for generating the second control signal Sc2 based on the second standard signal r2, a second filter coefficient updater 139 for sequentially updating a second filter coefficient W2 of the second adaptive filter 133. The second signal processor 151 further comprises the subtractor 120 for generating a signal ed2 that is produced by subtracting the first control signal Sc1 and the second control signal Sc2 from the error signal e1, and a one-sample time delay device 136 for delaying the signal ed2 by a one-sample time, and outputting the delayed signal ed2 to the second filter coefficient updater 139.

The first and second control signals Sc1, Sc2 are adjusted in phase and gain into respective first and second canceling signals Scp1, Scp2 by the first and second phase gain adjusters 46, 146. The first and second canceling signals Scp1, Scp2 are supplied to an adder 152, which adds them together into a sum signal.

The sum signal is supplied through the D/A converter 37 to the speaker 8, which outputs first and second canceling sounds into the interior compartment space 4. The microphone 6 detects residual noise produced by interference between the road noise and the first and second canceling sounds, and outputs an error signal e1 representing the detected residual noise. The error signal is converted by the A/D converter 35 into a digital error signal e1, which is supplied to the minuend input ports of the subtractors 20, 120.

Figure 6:
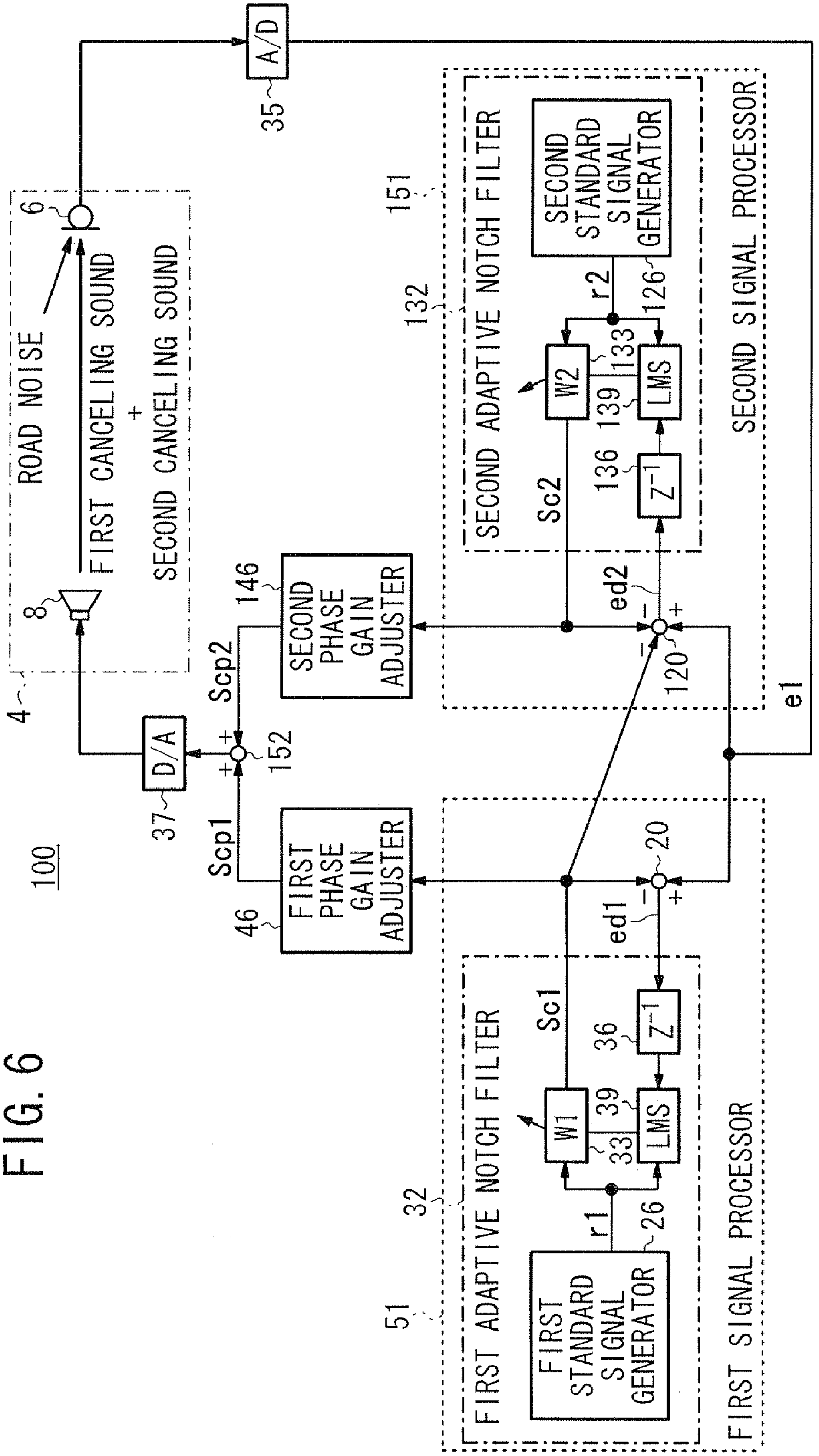
FIG. 6 is a block diagram showing a configuration of a vehicular active vibratory noise control apparatus according to an embodiment of the present invention.

In the vehicular active vibratory noise control apparatus 100 shown in FIG. 6, the first signal processor 51, the output of which is connected to the input of the first phase gain adjuster 46 that outputs the first canceling signal Scp1, is supplied only with the error signal e1 from the microphone 6. The second signal processor 151, the output of which is connected to the input of the second phase gain adjuster 146 that outputs the second canceling signal Scp2, is supplied with both the error signal e1 and the first control signal Sc1 that is subtracted from the error signal e1. Therefore, the first and second signal processors 51, 151 do not affect each other in operation, and the vehicular active vibratory noise control apparatus 100 can stably control road noise having two peak frequencies.

Either the first frequency fd1 or the second frequency fd2 of the road noise may be higher than the other. Specifically, if the first frequency fd1 is 40 Hz, then the second frequency fd2 is 70 Hz, whereas if the first frequency fd1 is 70 Hz, then the second frequency fd2 is 40 Hz.

In FIG. 6, the first signal processor 51 operates as a bandpass filter, which exhibits the passband frequency characteristic curve 250 shown in FIG. 3. The second signal generator 151 operates as a bandpass filter, having the second frequency fd=70 Hz as its central frequency. Therefore, the first signal processor 51 and the second signal generator 151 can be replaced with respective bandpass filters exhibiting central frequencies fd1 and fd2.

Figure 7:
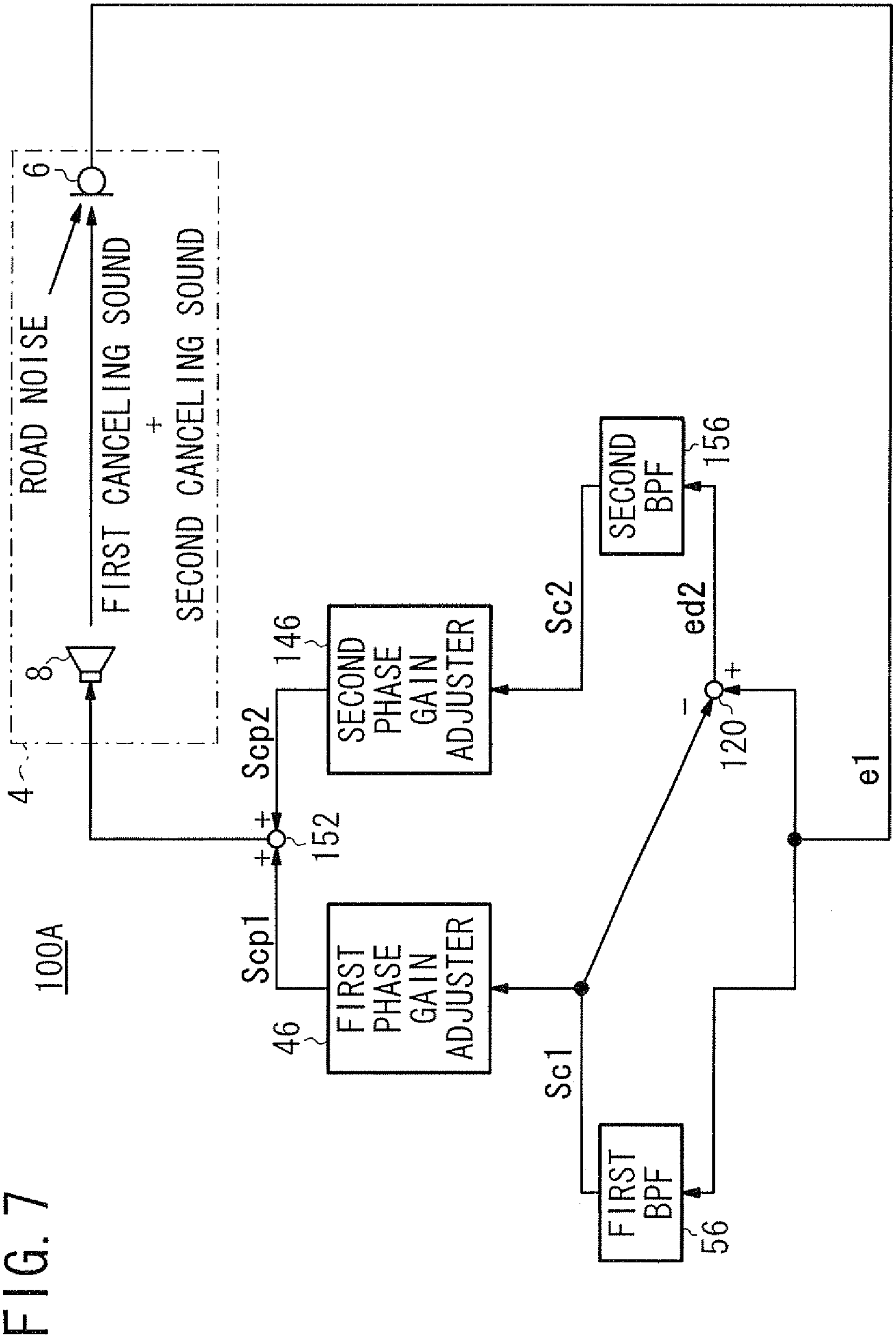
FIG. 7 is a block diagram showing a configuration of an analog vehicular active vibratory noise control apparatus according to another embodiment of the present invention, which employs a first bandpass filter in place of a first signal processor, and a second bandpass filter in place of a second signal processor.

FIG. 7 shows in block form a configuration of an analog vehicular active vibratory noise control apparatus 100A according to another embodiment of the present invention. The vehicular active vibratory noise control apparatus 100A is different from the vehicular active vibratory noise control apparatus 10A shown in FIG. 6, in that it employs a first bandpass filter 56 in place of the first signal processor 51, and a second bandpass filter 156 in place of the second signal processor 151.

Specifically, the vehicular active vibratory noise control apparatus 100A comprises a first bandpass filter 56 for extracting a first control signal Sc1 relative to a component of the road noise that exhibits the first frequency fd1, the first bandpass filter 56 having a central frequency set to the first frequency fd and being supplied only with the error signal e1, a second bandpass filter 156 for extracting a second control signal Sc2 relative to a component of the road noise that exhibits the second frequency fd2, the second bandpass filter 156 having a central frequency set to the second frequency fd2 and being supplied with a signal ed2, which is produced in the subtractor 120 by subtracting the first control signal Sc1 from the error signal e1, a first phase gain adjuster 46 for generating a first canceling signal Scp1 by adjusting the phase and gain of the first control signal Sc1, a second phase gain adjuster 146 for generating a second canceling signal Scp2 by adjusting the phase and gain of the second control signal Sc2, an adder 152 for adding the first canceling signal Scp1 and the second canceling signal Scp2 together into a sum signal and outputting the sum signal, a speaker 8 for outputting the sum signal as a combination of first and second canceling sounds into the interior compartment space 4, and a microphone 6 serving as an error signal detector for detecting, as the error signal e1, a residual vibratory noise due to interference between the first and second canceling sounds and the road noise at the evaluation point in the interior compartment space 4.

FIG. 5A shows a characteristic curve 212 of the road noise input to the first signal processor 51 of the vehicular active vibratory noise control apparatus 100 shown in FIG. 6, or to the first bandpass filter 56 of the vehicular active vibratory noise control apparatus 100A shown in FIG. 7. FIG. 5A also shows a characteristic curve 214 of the control signal Sc1 output from the first signal processor 51 or from the first bandpass filter 56. These characteristic curves 212, 214 are the same as those shown in FIG. 11A.

The first signal processor 51 or the first bandpass filter 56 extracts a component having a central frequency of 42 Hz, i.e., passes the component within the frequency band, for thereby reducing the noise at 70 Hz.

FIG. 5B shows a characteristic curve 216 of the road noise input to the second signal processor 151 of the vehicular active vibratory noise control apparatus 100 shown in FIG. 6, or to the second bandpass filter 156 of the vehicular active vibratory noise control apparatus 100A shown in FIG. 7. The characteristic curve 216 generally is equivalent to a characteristic curve generated by subtracting the characteristic curve 214 from the characteristic curve 212 shown in FIG. 5A. FIG. 5B also shows a characteristic curve 218, which represents the second control signal Sc2 output from the second signal processor 151 or from the second bandpass filter 156.

It can be seen from the characteristic curve 218 that the second signal processor 151 or the second bandpass filter 156 extracts a component having a central frequency of 70 Hz, i.e., passes the component within the frequency band, for thereby reducing noise at 42 Hz.

As described above, the first control signal Sc1 output from the first signal processor 51 (or the first bandpass filter 56) is subtracted from the error signal e1 by the subtractor 120, whereupon the differential signal is processed and supplied as the first control signal Sc1 to the second signal processor 151 (or the second bandpass filter 156). Therefore, although the second signal processor 151 (or the second bandpass filter 156) is affected by the operation (i.e., the first control signal Sc1) of the first signal processor 51 (or the first bandpass filter 56), the first signal processor 51 (or the first bandpass filter 56) is not affected by the operation (i.e., the second control signal Sc2) of the second signal processor 151 (or the second bandpass filter 156). Accordingly, the vehicular active vibratory noise control apparatus 100, 100A function with guaranteed stability.

Figure 8:
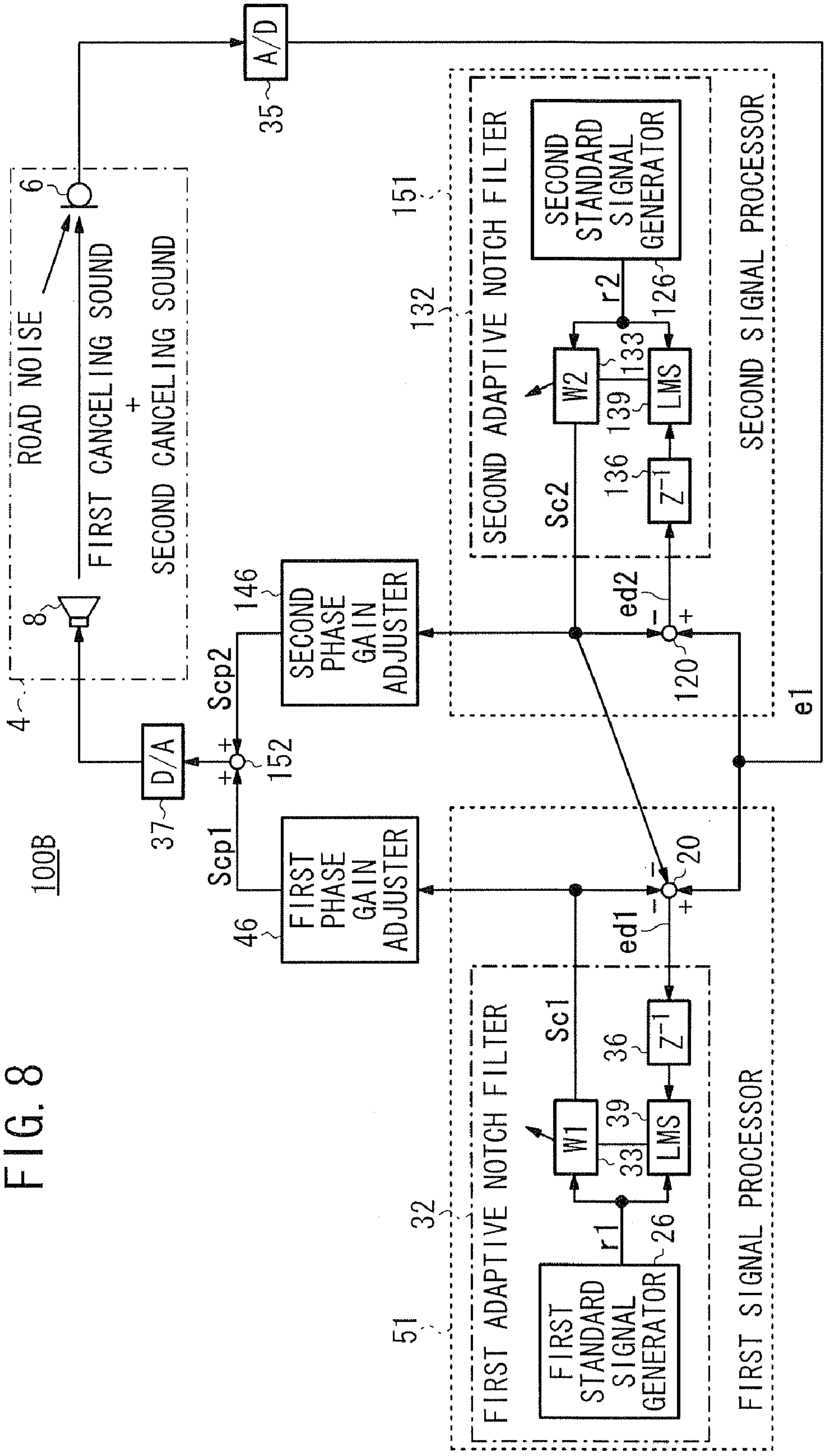
FIG. 8 is a block diagram showing a configuration of a vehicular active vibratory noise control apparatus according to a modification of the present invention, which employs adaptive notch filters as shown in FIG. 6.

FIG. 8 shows a vehicular active vibratory noise control apparatus 100B according to a modification of the present invention, which employs the adaptive notch filters shown in FIG. 6. In the vehicular active vibratory noise control apparatus 100B, the second control signal Sc2 is subtracted from the error signal e1 by the subtractor 20. The vehicular active vibratory noise control apparatus 100B offers the same advantages as those of the vehicular active vibratory noise control apparatus 100 shown in FIG. 6.

Figure 9:
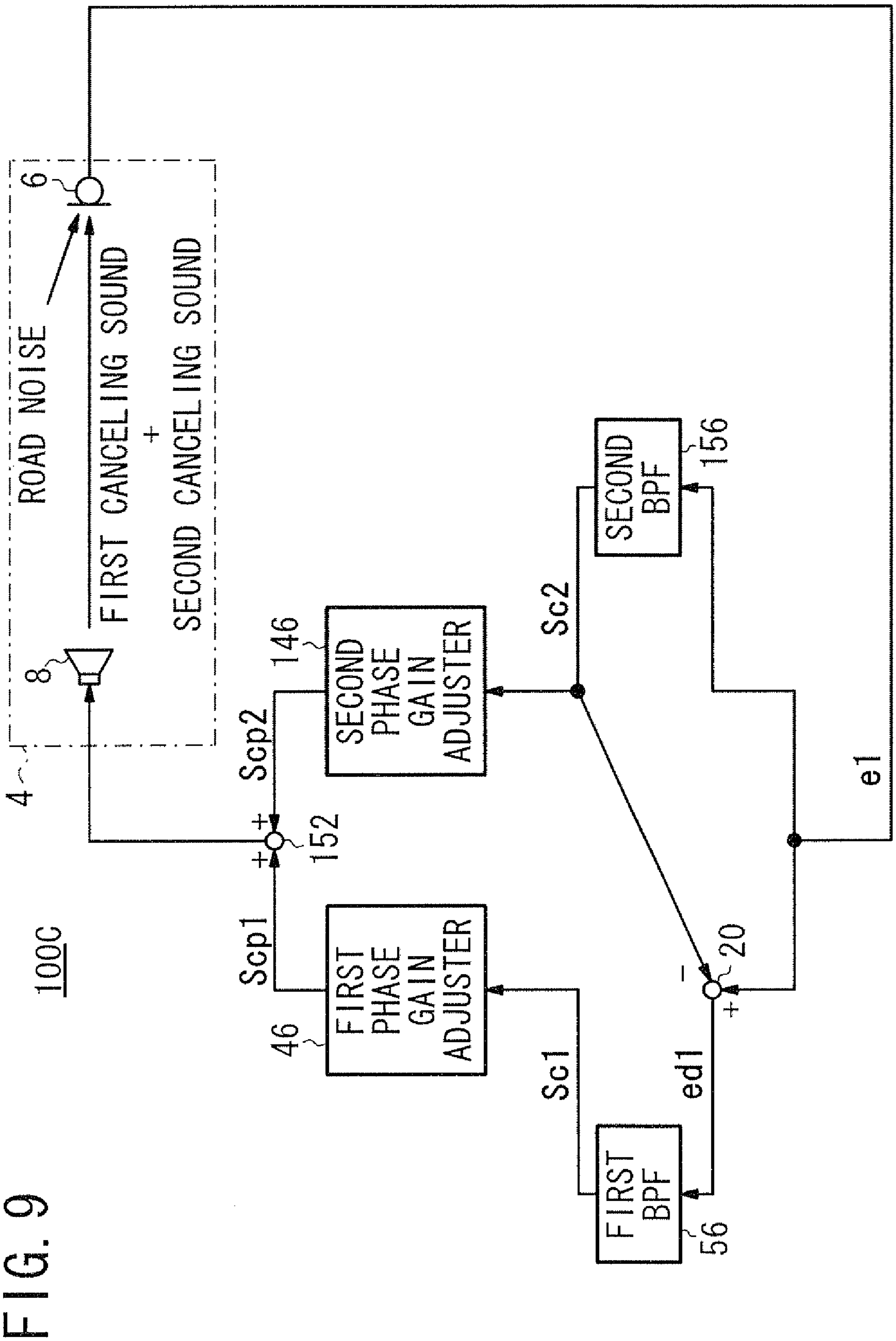
FIG. 9 is a block diagram showing a configuration of a vehicular active vibratory noise control apparatus according to another modification of the present invention, which employs bandpass filters as shown in FIG. 7.
Figure 10:
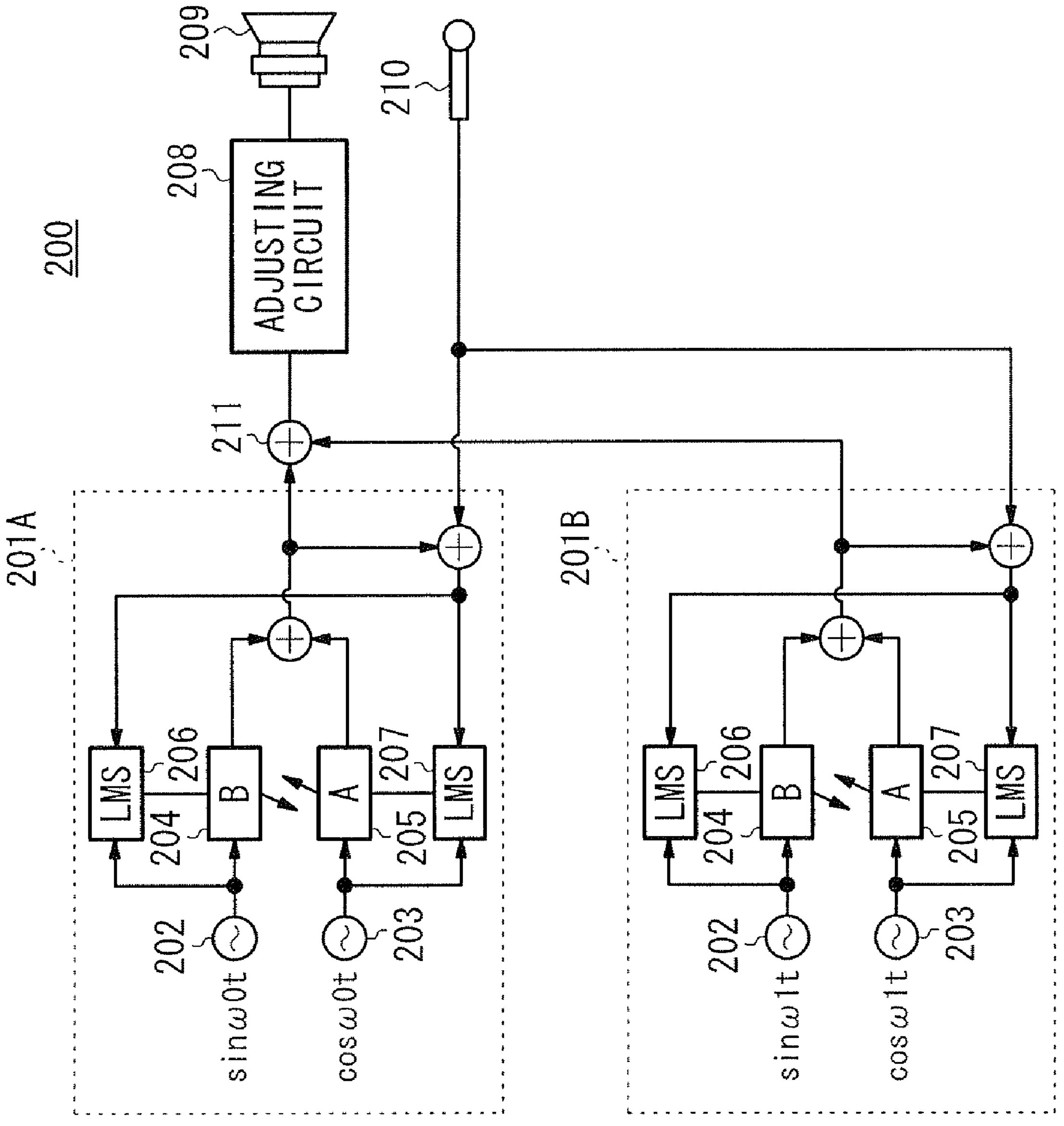
FIG. 10 is a block diagram showing a configuration of a vehicular active vibratory noise control apparatus according to the related art.

FIG. 9 shows a vehicular active vibratory noise control apparatus 100C according to another modification of the present invention, which employs the bandpass filters shown in FIG. 7. In the vehicular active vibratory noise control apparatus 100C, the second control signal Sc2 is subtracted from the error signal e1 by the subtractor 20. The vehicular active vibratory noise control apparatus 100C offers the same advantages as those of the vehicular active vibratory noise control apparatus 100A shown in FIG. 7.

Although certain preferred embodiments of the present invention have been shown and described in detail, it should be understood that various changes and modifications may be made to the embodiments without departing from the scope of the invention as set forth in the appended claims.

What is claimed is:

1. A vehicular active vibratory noise control apparatus comprising:
- a first bandpass filter for extracting a first control signal relative to a first frequency component of a road noise;
- a first phase adjuster for generating a first canceling signal by adjusting said first control signal in phase;
- a canceling sound output unit for outputting a first canceling sound based on said first canceling signal;
- an error signal detector for detecting, as an error signal, a residual vibratory noise due to interference between said first canceling sound and the road noise at an evaluation point;
- wherein said first bandpass filter is supplied only with said error signal, which is input thereto, and extracts the first control signal from said error signal;
- a second bandpass filter for extracting a second control signal relative to a second frequency component of the road noise;
- a second phase adjuster for generating a second canceling signal by adjusting said second control signal in phase; and
- an adder for adding said first canceling signal and said second canceling signal together into a sum signal, and outputting the sum signal to said canceling sound output unit;
- wherein said canceling sound output unit outputs a canceling sound based on said sum signal;
- said error signal detector detects, as said error signal, a residual vibratory noise due to interference between said canceling sound and the road noise; and
- said second bandpass filter is supplied with a signal produced by subtracting said first control signal from said error signal, and extracts said second control signal from the supplied signal.

2. A vehicular active vibratory noise control apparatus comprising:
- a first phase adjuster for generating a first canceling signal by adjusting a first control signal in phase;
- a canceling sound output unit for outputting a first canceling sound based on said first canceling signal;
- an error signal detector for detecting, as an error signal, a residual vibratory noise due to interference between said first canceling sound and a road noise at an evaluation point;
- a first signal processor for outputting a first control signal;
- wherein said first signal processor comprises:

a first standard signal generator for generating a first standard signal relative to a first frequency component of the road noise;

a first adaptive filter for generating said first control signal based on said first standard signal; and a first filter coefficient updater for sequentially updating a first filter coefficient of said first adaptive filter based on a signal produced by subtracting the first control signal of a preceding sample from the error signal;

a second phase adjuster for generating a second canceling signal by adjusting a second control signal in phase;

an adder for adding said first canceling signal and said second canceling signal together into a sum signal, and outputting the sum signal to said canceling sound output unit; and a second signal processor for outputting said second control signal;

wherein said canceling sound output unit outputs a canceling sound based on said sum signal;

said error signal detector detects, as said error signal, a residual vibratory noise due to interference between said canceling sound and the road noise; and said second signal processor comprises:

a second standard signal generator for generating a second standard signal relative to a second frequency component of the road noise;

a second adaptive filter for generating said second control signal based on said second standard signal; and a second filter coefficient updater for sequentially updating a second filter coefficient of said second adaptive filter, based on a signal produced by subtracting said second control signal of a preceding sample and said first control signal of the preceding sample from said error signal.

* * * * *